July 28, 1970 J. DEBIESSE ET AL 3,522,106

THERMOELECTRIC GENERATORS

Filed May 9, 1966 2 Sheets-Sheet 1

BY William W. Stokes

ATTORNEY

July 28, 1970 J. DEBIESSE ETAL 3,522,106

THERMOELECTRIC GENERATORS

Filed May 9, 1966 2 Sheets-Sheet 2

BY William D. Stokes 3,522,106
THERMOELECTRIC GENERATORS

Jean Debiesse, Boulogne-sur-Seine, and Siegfried Klein, Paris, France, assignors to Commissariat a l'Energie Atomique, Paris, France, a French organization Filed May 9, 1966, Ser. No. 548,456
Claims priority, application France, May 9, 1965, 17,644
Int. Cl. G21h *1/10;* H01v *1/02*
U.S. Cl. 136—202 12 Claims

ABSTRACT OF THE DISCLOSURE

A generator comprising p-type and n-type semiconductor elements made of slightly compressed powders. The semiconductor elements are stacked alternately with the interposition of insulating elements leaving junctions between the semiconductor elements. The junctions so formed are disposed in such manner as to form a semiconductor meandering path. The semiconductor elements are firmly compressed in the stack.

The present invention relates to thermoelectric generators, that is to say to devices for transforming, in a direct manner (without passing through the intermediate of mechanical energy) and without pieces in movement, heat energy into electrical energy by application of the thermoelectric effect called Seebeck effect. The invention is more especially, but not exclusively, concerned with generators of this kind wherein the heat energy is supplied by chain fission reactions.

The chief object of our invention is to provide improvements in thermoelectric generators with a view to increasing, on the one hand, the specific power (electric power available per volume or mass unit) and, on the other hand, the facility of application, especially in a nuclear reactor.

The invention has for its object a thermoelectric generator which comprises n-type semiconductor elements and p-type semiconductor elements, all these elements being made of slightly compressed powders, stacked alternately against one another, with the interposition between them of thin insulating elements, the whole being tightly held between two electric terminals so as strongly to compress the powders, every insulating element extending over only a portion of the area of the two semiconductor elements, respectively of the n-type and of the p-type, between which it is located, so as to ensure a junction between said two last mentioned elements, whereby a meandering or zig-zag path is formed through said semiconductor elements along said junctions, the junctions being alternately connected to a high temperature source and to a low temperature sink.

The invention applies particularly the thermoelectric generators for directly transforming nuclear energy into electrical energy and it is more especially concerned with some particular embodiments such as follows:

The insulating elements and the semiconductor elements (of the n-type and p-type) consist of discs or rings, the insulating discs or rings being much thinner than the semiconductor discs or rings;

The n-type and p-type semiconductor elements comprise a high proportion of a fissionable or fertile material (such a material being designated hereinafter by the term "at least potentially fissionable material"), in particular of uranium oxide or carbide, or even may be constituted by such a material suitably doped to be of the n-type or the p-type, respectively;

The stack of semiconductor elements (in particular of discs or rings) alternately of the n-type and of the p-type is housed in a metallic tube lined on its inner surface with a very thin film of a thermally insulating material, in particular of alumina, this tube being in contact through its outer surface with one of the bodies at different respective temperatures of the system, in particular with the low temperature sink or cold body; the stack may also be disposed about an inner metallic tube lined on its outer surface with a thermally insulating very thin film, in paritcular of alumina, this second tube being in contact through its inner surface with the other body and in particular with the high temperature source or hot body.

Preferred embodiments of our invention will be hereinafter described with reference to the appended drawings, given merely by way of example, and in which.

Figure 1:
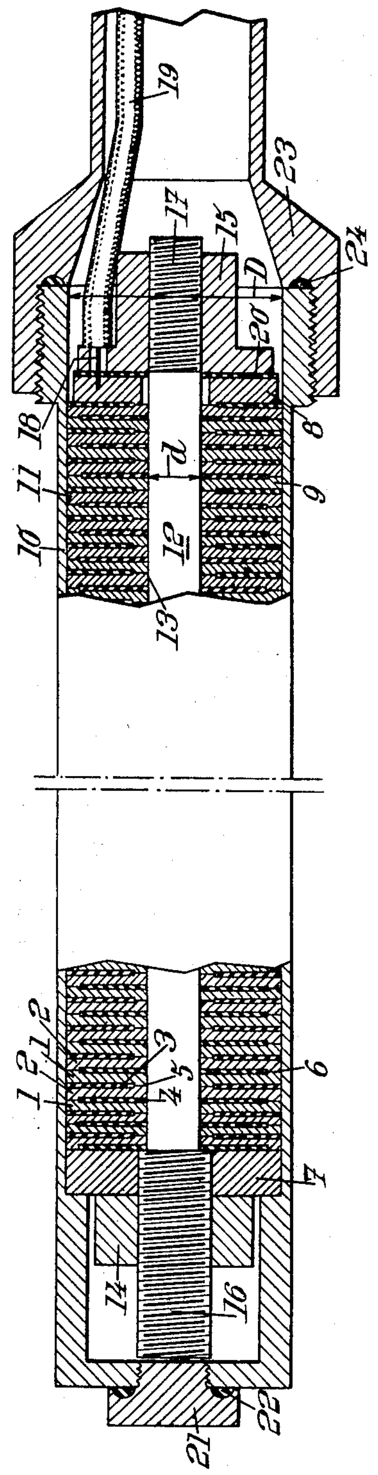
FIG. 1 shows in longitudinal section a first embodiment of a thermoelectric generator according to the invention wherein the stack of semiconductor elements of the n-type and of the p-type is housed between two metallic tubes, a stream of hot fluid flowing through the inner tube.

The generator of FIGS. 1 to 4 includes n-type semiconductor elements 1 and p-type semiconductor elements 2, both made of slightly compressed powders. These elements are stacked alternately with the interposition between them of thin insulating elements 3, 4 extending over a portion of the surface along which two adjoining elements, one of the n-type and the other of the p-type, adjoin each other. These elements are strongly applied against one another in such manner as strongly to compress the powders and to ensure an intimate contact at the junctions 5, 6 between two successive semiconductor elements, where the insulating elements 3–4 do not extend. The generator comprises two electric terminals 7, 8 between which is formed a semiconductor path 9 of meandering or zig-zag shape, limited by insulating elements 3, 4, the contact portions between semiconductor elements of opposed types being alternately connected to high temperature sources and a low temperature sink.

Figure 4:
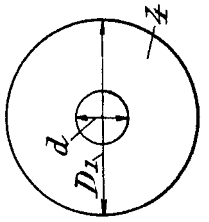
FIGS. 2, 3 and 4 are end views showing respectively a first type of insulating element, a semiconductor element of the n-type or the p-type, and a second type of insulating element, for use in the generator of FIG. 1.
Figure 3:
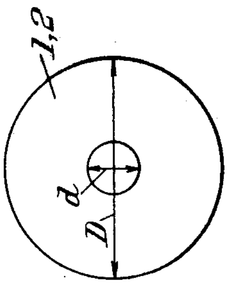
Figure 2:
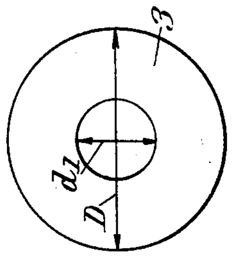

Advantageously, as shown, insulating elements 3, 4 and semiconductor elements, 1 of the n-type and 2 of the p-type, consist of flat rings, as illustrated by FIGS. 2 to 4, the insulating rings being much thinner than the semiconductor rings.

The stack of rings is housed in a metallic tube 10 lined on its inner surface with an electricity insulating thin film 11, for instance a film of alumina, the outer surface of tube 10 being connected with the low temperature sink.

The stack of rings is also disposed about an inner metallic tube 12 having its outer surface lined with a thin electricity insulating film 13, for instance of alumina. This tube 12 has its inner surface in communication with the high temperature source.

Films 11 and 13 serve to prevent an electric short-circuit through tubes 10 and 12. The semiconductor path 9 must have a meandering shape while allowing a sufficient stream of heat to pass therethrough.

Elements 1 and 2 (FIG. 3) consist of circular rings the inner diameter $d$ of which is equal to the outer diameter of tube 12 lined with film 13 whereas the outer diameter of said circular rings is equal to the inner diameter D of tube 10 lined with film 11.

The insulating elements consist of circular rings of two types, to wit a type 3 (FIG. 2) having an inner diameter $d_1$ greater than $d$ and an outer diameter equal to D, and a type 4 (FIG. 4) having an inner diameter equal to $d$ and an outer diameter $D_1$ smaller than D, whereas the junction surfaces 5, 6 are located alternately on the inner side and the outer side between semiconductor elements 1–2, whereby the path 9 is meandering or zig-zag shaped.

In order to tighten the stack of semiconductor and insulating rings and thus to ensure that, at junctions 5 and 6, semiconductor surfaces of opposed types are tightly applied against one another, we make use of two nuts 14 and 15 screwed on the threaded heads 16 and 17 of tube 12, which urges terminals 7 and 8 toward each other. One of these terminals, to wit 7, is grounded by being in contact with the external tube 10 without the interposition of an insulating film whereas the other terminal, 8, is connected to a conductor 18 protected by an insulating sheath 19, the end of terminal 8 being insulated, on the one hand, from nut 15 by an insulating ring 20 and, on the other hand, from the external tube 10.

Finally, a plug 21 provided with a fluidtight packing element 22 closes one of the ends of tube 10, the other end of which carries, screwed thereon, a nut 23 making it possible to assemble this thermoelectric generator unit with another similar unit mounted in series, a fluidtight packing member being also provided at 24.

A heat conveying fluid (consisting for instance of smoke gases if the source of heat is conventional, that is to say purely thermal, or of carbonic acid gas, heavy or light water, or the sodium-potassium eutectic molten mixture, if the source of heat is a nuclear reactor), flows through tube 12 and constitutes a hot source for junctions 5 whereas the external surface of tube 10 constitutes the low temperature sink (along which flows a cooling fluid or which may be provided with cooling fins) for junctions 6.

By way of example, tubes 10 and 12 may be made of aluminum, films 11 and 13 of alumina, insulating rings 3 and 4 of mica, the thickness being smaller than 1 mm., disc 20 also of mica, but of a thickness averaging, or greater than, 1 mm., and discs 1 and 2 are of a thickness ranging from 2 to 5 mm.

Also by way of example, n-type rings 1 may be made of bismuth telluride ($Bi_2Te_3$) or of bismuth, while p-type rings 2 are made of a mixture of one-half of bismuth telluride and one-half of tellurium with the addition of a small amount of silicon, these compounds being free from oxides because oxygen reduces the electromotive force available across the terminals of the generators.

The n-type rings may also be made of the ternary pseudo-compound InAsP and the p-type rings of the alloy GeTe.

Finally, it is advantageous to coat with gold the surfaces of contact of metallic terminals 7, 8 with the end semiconductor elements.

With such an arrangement, we made a generator including 80 n and p elements in series, the active portion of the stack of these elements having a length of 200 mm. and a diameter of 50 mm. ($D$=50 mm., whereas the diameter of the inner tube 12 was 13 mm.). Such a thermoelectric generator had an internal resistance of 0.5 ohm and delivered 4 amperes under 3 volts when the hot body was at 400° C. and the cold body at 20° C., the yield being 2%.

During operation, an improvement of the performances was found to occur as time went on, probably due to the improvement of the contacts of the n and p semiconductor elements along junction surfaces 5 and 6 under the combined effect of heat and pressure.

According to a modification of our invention, the hot body might be constituted by polonium the disintegration of which would heat up tube 10 in which this polonium would be housed.

Figure 5:
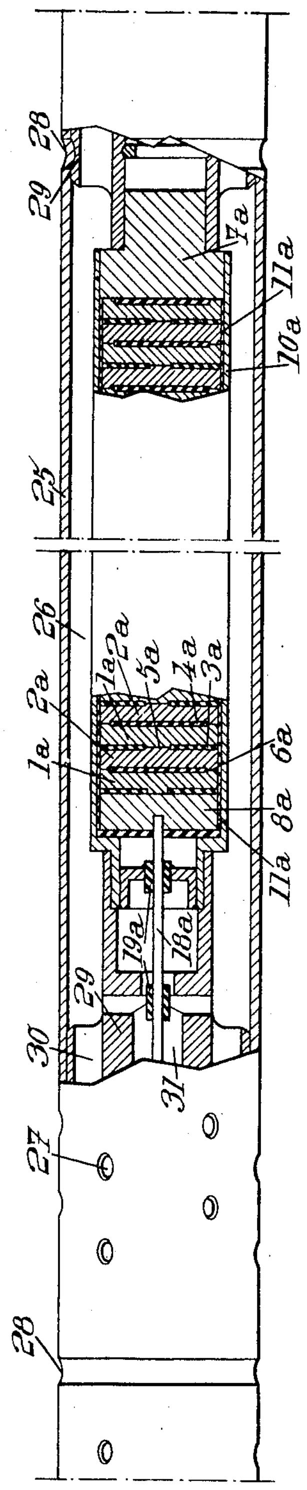
FIG. 5 is a longitudinal sectional view of a second embodiment of the invention wherein the n-type and p-type semiconductor elements consist chiefly of fissionable material and are stacked in a metallic tube cooled from the outside.

FIG. 5 shows a second embodiment. In this figure, the references of FIG. 1 have been used with index *a* to designate elements having not exactly the same shape or the same dimensions as in FIG. 1.

In the construction of FIG. 5, the n-type semiconductor elements 1*a* and p-type semiconductor elements 2*a* consist of discs of the same diameter having a thickness ranging from 2 to 5 mm. The thin insulating elements 3*a* and 4*a*, of a thickness smaller than 1 mm. consist alternately of discs 4*a* and rings 3*a*. With this arrangement, the central contact surfaces 5*a* are circular, whereas the peripheral contact surfaces 6*a* are circular rings.

In this case also, terminal 7*a* is grounded by being in contact wtih tube 10*a* in a portion thereof where it is not lined with an insulating film. Terminal 8*a*, insulated from tube 10*a* by insulating film 11*a*, which may be made thicker, is connected to a conductor 18*a* extending through insulating sleeves 19*a* to extend toward another thermoelectric element not shown by the drawings.

As a matter of fact, FIG. 5 corresponds to the case where the n-type and p-type semiconductor elements are chiefly made of a fissionable or fertile material such as uranium oxide or carbide doped by bismuth or tellurium. Elements 1*a* and 2*a* may include for instance from 80 to 90% of uranium oxide or carbide, or even practically 100% of uranium oxide or carbide (neglecting the small amounts generally averaging 1%, of doping additives such as bismuth or tellurium).

These elements are prepared by intimately mixing uranium oxide or carbide, in the state of powder, and bismuth or tellurium, also in the state of powder, and by slightly compressing the intimate mixture of powders so as to give it a consistency sufficient for making it possible to introduce the elements into tube 10*a* as illustrated by FIG. 5.

The whole, disposed in a tube 10*a*, constitutes, after final compression, the nuclear cartridge housed, together with others, in a reactor channel 25, a coolant fluid passing through this channel along the external wall of tube 10*a* through annular space 26. The nuclear reactor then comprises several channels 25, either horizontal or vertical, provided with orifices 27, and grooves 28 serve to keep in position the thermoelectric elements disposed in series in every channel, by squeezing guiding pieces 29 which support the thermoelectric elements. These guiding pieces include, on the one hand, passages 30 communicating with spaces 26 and, on the other hand, passages 31 for conductors 18*a* serving to connect the different elements together.

In the embodiment of FIG. 5, tube 10*a* is made of stainless steel and its internal diameter is 28 mm. whereas its external diameter is 32 mm. The length of a thermoelectric generator of the illustrated type is 298.5 mm. the pitch of a generator-guide unit being 445.5 mm.

By way of non limitative examples, of thermoelements consisting chiefly of uranium that may be used for carrying out the invention we may cite:

1/US (uranium monosulfide) conductivity: p-type
Thermoelectric power in $\mu v./°C.{:}\alpha\approx 58$
Electric resistivity in $\mu\Omega$ cm.:$C\approx 310$
Thermal conductivity in $w./°$ C. cm.:$K\approx 0.1$
Quality factor in $10^{-4}$ deg. $C.^{-1}{:}Z\approx 1.0$ 2/UOSe (uranium oxyselenide) conductivity: n-type
$\alpha\approx 160$
$C\approx 20$
$K\approx 0.0083$
$Z\approx 1.6$ 3/UN (uranium nitride)+1.1% of C
conductivity: p-type
$\alpha\approx 53$
$C\approx 100$
$K\approx 0.088$
$Z\approx 1.6$ 4/UOS (uranium oxysulfide) conductivity: n-type $\alpha \approx 150$
$C \approx 78$
$K \approx 0.037$
$Z \approx 0.07$ A nuclear reactor may include either solely fissionable material in the form of thermoelectric elements or both nuclear fuel cartridges of the conventional type and cartridges constituting thermoelectric elements according to the present invention. It is even possible to provide a reduced number of such thermoelectric elements in a reactor, for instance one element for every channel, and to supervise the voltage supplied by every element in order to detect a defect in the operation of the reactor, in particular a break of the jacket surrounding one of the nuclear fuel elements.

In the embodiment of FIG. 5, we may provide a central rod upon which will be slipped the semiconductor elements 1*a* and 2*a* and the insulating elements 3*a*.

According to the present invention, we obtain a thermoelectric generator which has over the thermoelectric generator of the prior art, many advantages, and in particular the following ones:

Its specific power (electric power available per volume or mass unit) is high.

It takes the best possible advantages of the Seebeck electromotive force of the semiconductor materials that are used:

The electric contacts between successive n-type and p-type elements are excellent, whereas the stream of heat through these contacts is delayed due to the fact that there does not exist an ohmic contact between the adjacent elements of n-type and p-type.

This generator may operate in good conditions with very different values of the difference of temperature between the hot body and the cold body.

The thermoelectric generator according to this invention can make use of semiconductor materials of very different kinds, in particular doped fissionable or fertile materials.

It is easy to manufacture and its mechanical and thermal resistance is excellent.

It may be used in a nuclear reactor to detect the defects and control the behaviour of the different portions of the reactor in particular to detect jacket breaks.

A system of generators according to the present invention permits of directly transforming the fission energy of a nuclear reactor into electrical energy.

In a general manner while we have in the above description disclosed what we deem to be practical and efficient embodiments of the present invention, it should be well understood that we do not wish to be limited thereto as there might be changes made in the arrangement, disposition and form of the parts without departing from the principle of the present invention as comprehended within the scope of the appended claims.

What we claim is:

1. A thermoelectric generator including n-type semiconductor elements and p-type semiconductor elements stacked alternately against one another with the interposition of a thinner insulating element between two successive opposite type semiconductor elements, each insulating element extending over only a portion of the two successive semiconductor elements between which it is interposed, thereby ensuring a junction between said elements of opposite type, successive insulating elements extending over non-aligned portions of the stack of semiconductor elements, thereby forming a meandering semiconducting path along said stack of semiconductor elements through each said junction, means for cooling alternate ones of the succession of junctions, means for heating the remaining junctions and electric terminals permitting the collection of the difference of potential produced at the two extremities of said stack, characterized in that each of said semiconductor elements is in a powdered state comprising a doped semiconductor material slightly compressed to a consistency sufficient to enable stacking of each of said elements, and means for tightly compressing the stack of said semiconductor elements in said generator to ensure a continuous surface contact between adjacent elements in said stack.

2. A thermoelectric generator according to claim 1 wherein said elements are flat, said insulating elements being much thinner than said semiconductor elements.

3. A thermoelectric generator according to claim 1 wherein said semiconductor elements comprise a large amount of an at least potentially fissionable material and additions of doping materials making them semiconductors of the n-type and of the p-type, respectively.

4. A thermoelectric generator according to claim 1 wherein said semiconductor elements are made of an at least potentially fissionable material to which has been added a small amount of a doping material making said elements n-type or p-type semiconductors.

5. A thermoelectric generator according to claim 3 wherein said fissionable material consists of uranium oxide.

6. A thermoelectric generator according to claim 4 wherein said fissionable material consists of uranium oxide.

7. A thermoelectric generator according to claim 3 wherein said fissionable material consists of uranium carbide.

8. A thermoelectric generator according to claim 4 wherein said fissionable material consists of uranium carbide.

9. A thermoelectric generator according to claim 1, co-operating with a high temperature source and a low temperature sink, further comprising a metallic tube surrounding said stack of elements and a film of an insulating material lining the inner surface of said tube, said tube having its outer wall in contact with one of said high temperature source and low temperature sink.

10. A thermoelectric generator according to claim 9 further comprising an internal tube surrounded by said stack of elements and a very thin insulating film lining the external surface of said second tube, this second tube having its inner wall in contact with the other of said high temperature source and low temperature sink.

11. A thermoelectric generator according to claim 10 wherein said tube insulating films are made of alumina.

12. A thermoelectric generator which comprises, in combination, a first multiplicity of flat elements made of a first semiconductor material, a second multiplicity of flat elements made of a second semiconductor material, one of said semiconductor materials being of the n-type and the other of the p-type, at least one of said materials being at least potentially fissionable, said two multiplicities of elements being juxtaposed to form a stack with an element of one multiplicity located between two elements of the other multiplicity, each of said semiconductor elements being in a powdered state, slightly compressed to a consistency sufficient to enable stacking, the flat elements of the multiplicity made of fissionable material being provided, respectively, on one side thereof, with central circular flat projections extending all in a first direction and, on the other side thereof, with peripheral annular flat projections extending in a second direction opposed to the first one, and the flat elements of the other multiplicity being provided, respectively, on one side thereof, with central circular flat projections extending in said second direction to cooperate with the central circular flat projections of the multiplicity made of fissionable material, to form central circular junctions, and said flat elements of said other multiplicity being provided, respectively, on the other side thereof, with peripheral annular flat projections extending in said first direction to cooperate with the peripheral annular projections of the multiplicity made of fissionable material to form peripheral annular junctions, insulating flat elements between the portions of two adjoining semiconductor elements from which said flat projections extend, means for pressing all of said elements together, for further strongly compressing said powders, means forming an annular cold passage for the evacuation of heat, in thermal contact with only said peripheral annular junctions, and two electric current terminals in contact with the respective ends of said stack.

References Cited

UNITED STATES PATENTS

| | | | |
|---|---|---|---|
| 775,188 | 11/1904 | Lyons et al. | 136—208 |
| 3,082,275 | 3/1963 | Talaat | 136—208 |
| 3,167,482 | 1/1965 | Katz | 136—202 X |
| 3,189,765 | 6/1965 | Danko et al. | 136—202 X |
| 3,197,342 | 7/1965 | Neild | 136—210 |
| 3,272,658 | 9/1966 | Rush | 136—208 X |
| 3,301,714 | 1/1967 | Lyman | 136—212 |

FOREIGN PATENTS

| | | |
|---|---|---|
| 900,888 | 7/1962 | Great Britain. |

ALLEN B. CURTIS, Primary Examiner

U.S. Cl. X.R.

29—573; 136—208

UNITED STATES PATENT OFFICE

CERTIFICATE OF CORRECTION

Patent No. 3,522,106 Dated July 28, 1970

Inventor(s) Jean Debiesse and Siegfried Klein

It is certified that error appears in the above-identified patent and that said Letters Patent are hereby corrected as shown below:

Column 1, change the date of the French priority application to read -- May 19, 1965 --.

SIGNED AND SEALED NOV 24 1970

(SEAL)
Attest:

Edward M. Fletcher, Jr.
Attesting Officer

WILLIAM E. SCHUYLER, JR.
Commissioner of Patents

FORM PO-1050 (10-69)

USCOMM-DC 60376-P69
☆ U.S. GOVERNMENT PRINTING OFFICE : 1969 O—366-334

UNITED STATES PATENT OFFICE
CERTIFICATE OF CORRECTION

Patent No. 3,522,106 Dated July 28, 1970

Inventor(s) Jean Debiesse and Siegfried Klein

It is certified that error appears in the above-identified patent and that said Letters Patent are hereby corrected as shown below:

Column 1, change the date of the French priority application to read -- May 19, 1965 --.

SIGNED AND SEALED NOV 24 1970

(SEAL)
Attest:

Edward M. Fletcher, Jr.
Attesting Officer

WILLIAM E. SCHUYLER, JR.
Commissioner of Patents

FORM PO-1050 (10-69)
USCOMM-DC 60376-P69
☆ U.S. GOVERNMENT PRINTING OFFICE : 1969 O—366-334